United States Patent [19]
Lane et al.

[11] Patent Number: 5,648,923
[45] Date of Patent: Jul. 15, 1997

[54] NYQUIST FILTER FOR USE IN A JOINT VSB/QAM DEMODULATOR

[75] Inventors: Frank A. Lane, Medford Lakes; Joshua L. Koslov, Hopewell, both of N.J.

[73] Assignee: Hitachi America, Ltd., Tarrytown, N.Y.

[21] Appl. No.: 397,441

[22] Filed: Mar. 2, 1995

[51] Int. Cl.$^6$ .................................................. G06F 17/10
[52] U.S. Cl. .......................... 364/724.16; 364/724.13
[58] Field of Search ........................... 364/724.16, 724.13

[56] References Cited

U.S. PATENT DOCUMENTS

| | | | |
|---|---|---|---|
| 3,851,252 | 11/1974 | Karnaugh et al. | 375/353 |
| 5,050,119 | 9/1991 | Lish | 364/724.16 |
| 5,067,140 | 11/1991 | Weinert | 375/77 |
| 5,157,622 | 10/1992 | Makino | 364/724.16 |
| 5,212,660 | 5/1993 | Orihara | 364/724.16 |
| 5,381,354 | 1/1995 | Soloff | 364/724.16 |
| 5,410,368 | 4/1995 | Krishnamurthy et al. | 348/726 |
| 5,418,815 | 5/1995 | Ishikawa et al. | 375/216 |
| 5,479,363 | 12/1995 | Willson, Jr. et al. | 364/724.16 |
| 5,479,449 | 12/1995 | Patel et al. | 375/316 |
| 5,487,023 | 1/1996 | Seckora | 364/724.13 |
| 5,506,636 | 4/1996 | Patel et al. | 348/725 |

*Primary Examiner*—David H. Malzahn
*Attorney, Agent, or Firm*—Michaelson & Wallace; Michael P. Straub; Peter L. Michaelson

[57] ABSTRACT

A Nyquist filter implemented as a FIR filter comprising a series of N filter cells, where N is an integer is disclosed. The Nyquist filter is especially well suited for use in demodulators capable of demodulating both VSB and QAM signals. During VSB mode operation, each filter cell acts as a single tap of an N tap Nyquist filter. During QAM mode operation, an additional unit delay element, not used during VSB mode operation, is inserted into the signal path of each cell of the Nyquist filter. The introduction of this second unit delay element into the signal path of each filter cell effectively serves to convert each filter cell into two filter taps with the coefficient of the second filter tap being zero. Thus, during QAM mode operation, the Nyquist filter of the present invention operates as a 2N-tap FIR filter which has coefficients of zero for half of the 2N taps.

11 Claims, 7 Drawing Sheets

NYQUIST FILTER FOR USE IN A JOINT VSB/QAM DEMODULATOR

FIELD OF THE INVENTION

The present invention is directed to Nyquist filters, and more particularly, to Nyquist filters suitable for use in demodulators capable of demodulating VSB and/or QAM signals.

BACKGROUND OF THE INVENTION

The use of quadrature amplitude modulation ("QAM") and vestigial sideband ("VSB") modulation for transmitting data, such as high definition television ("HDTV") signals, is growing in popularity.

In the United States, Advanced television ("ATV") systems, which include, e.g., HDTV systems, appear to be headed in two different directions with regard to the type of modulation used to transmit television signals.

At present, cable companies in the United States are preparing to transmit digital signals over cable using a QAM technique of data transmission.

On the other hand, the terrestrial television industry in the U.S. is planning to broadcast digital HDTV, e.g., ATV signals, using a Vestigial SideBand ("VSB") technique of data transmission proposed by Zenith corporation/Grand Alliance.

Accordingly, to be capable of receiving and displaying both cable and terrestrial HDTV television transmissions, a television receiver may have to be capable of receiving and demodulating both QAM and VSB HDTV signals. In order to reduce the cost of implementing such televisions, it is desirable that the amount of common circuitry used for demodulating VSB and QAM signals be maximized.

Nyquist filters are often used as part of a demodulator. In order to provide demodulation of multiple signal formats, e.g., VSB and QAM formats, in the most cost effective manner, a single demodulator should be able to handle either signal format with a minimum of extra hardware. Accordingly, there is a need for a Nyquist/matched filter which can be used with both VSB and QAM signals. In addition, there is a need for such a filter be capable of being implemented with little or no additional cost over the cost of a single format Nyquist filter.

SUMMARY OF THE PRESENT INVENTION

The present invention is directed to Nyquist filters suitable for use with VSB and/or QAM signals.

In particular, the present invention is directed to a Nyquist filter that can be used, e.g., in a demodulator that includes a separate phase split filter and Nyquist filter for processing a received signal. Such a filtering approach is particularly well suited for implementing a joint VSB/QAM demodulator.

In accordance with the present invention, the Nyquist filter is implemented as e.g. a finite impulse response (FIR) filter, comprising a series of, e.g., N filter cells, where N is an integer. The FIR filter of the present invention may be either real or complex, e.g., it can have real or complex inputs and outputs and use real or complex filter coefficients.

During VSB mode operation, each filter cell acts as a single tap of an N tap Nyquist filter. During QAM mode operation, an additional unit delay element, not used during VSB mode operation, is inserted into the signal path of each cell of the Nyquist filter. The introduction of this second unit delay element into the signal path of each filter cell effectively serves to convert each filter cell into two filter taps with the coefficient of the second filter tap being zero. Thus, during QAM mode operation, the Nyquist filter of the present invention operates as a 2N-tap FIR filter which has coefficients of zero for half of the 2N taps.

In accordance with the present invention, the introduction of the second unit delay element into the signal path of each filter cell is achieved using, e.g., a multiplexer which is responsive to a signal indicating whether the Nyquist filter of the present invention should operate in VSB or QAM mode.

Various additional features of the present invention are described in the detailed description set forth below.

DETAILED DESCRIPTION

The present invention is directed to methods and apparatus for the efficient implementation of Nyquist filters and Nyquist filter circuitry suitable for use in a demodulator capable of demodulating VSB and/or QAM signals.

The Nyquist filter of the present invention is suitable for use in VSB and/or QAM demodulators. For example, it can be used as the Nyquist filter of the joint VSB/QAM demodulator disclosed in U.S. patent application Ser. No. 08/354,303, titled "METHOD AND APPARATUS FOR DEMODULATING QAM AND VSB SIGNALS" which is hereby expressly incorporated by reference.

Figure 1:
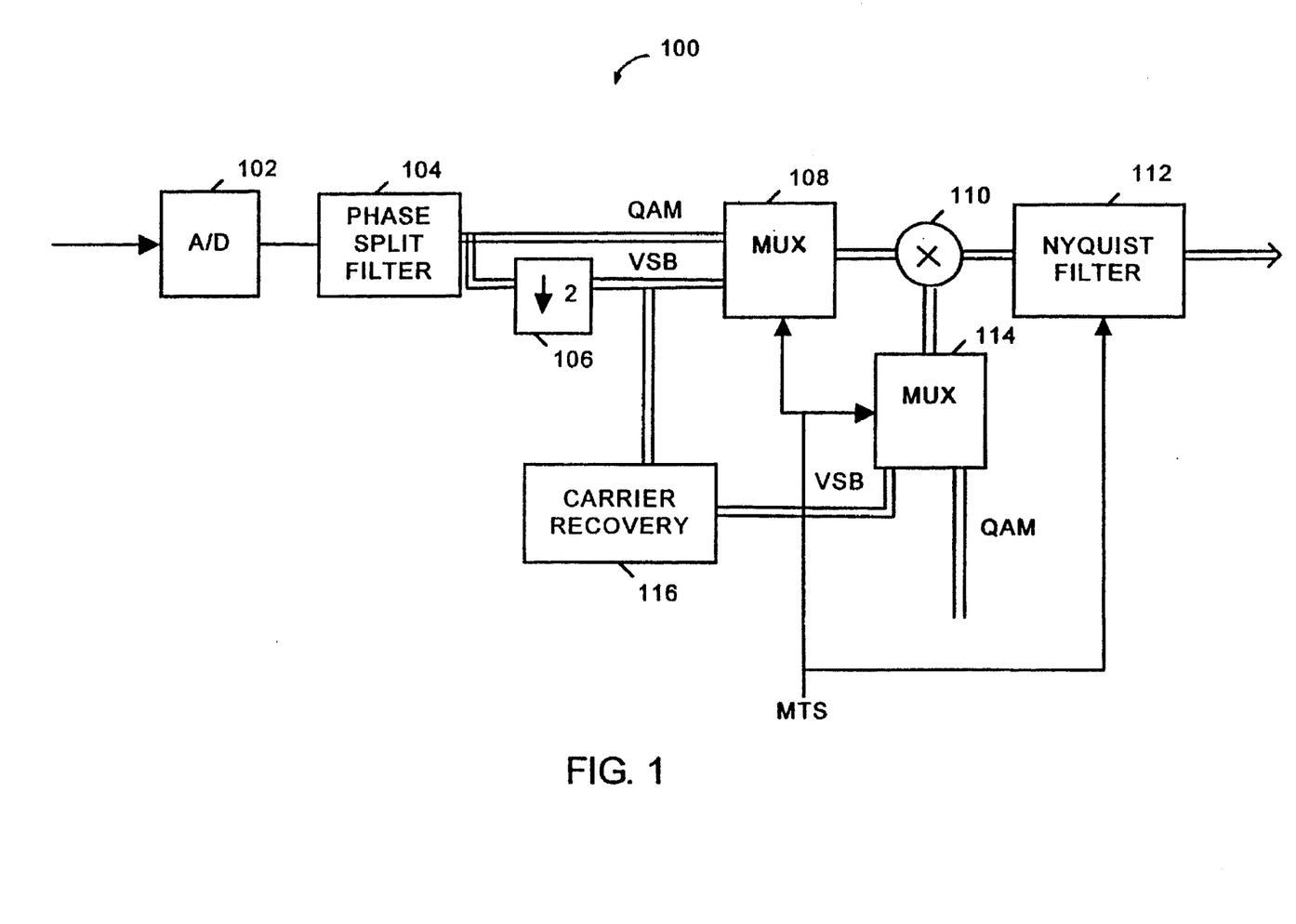
FIG. 1 is a schematic block diagram of a joint VSB/QAM demodulator including a Nyquist filter implemented in accordance with one embodiment of the present invention.

Referring now to FIG. 1, there is illustrated a joint VSB/QAM demodulator 100 which includes a Nyquist filter 112 which is implemented in accordance with the present invention.

As illustrated, the joint VSB/QAM demodulator 100, comprises an analog to digital (A/D) converter 102, a phase split filter 104, a decimater 106, a first multiplexer MUX 108, a carrier recover circuit 116 a second multiplexer MUX 114, a multiplier 110 and the Nyquist filter 112.

In accordance with the present invention, the first and second MUXes 108, 114 and the Nyquist filter 112 are controlled by a modulation type selection (MTS) signal which indicates whether the demodulator 100 is to be configured as a VSB or QAM demodulator.

Figure 2A:
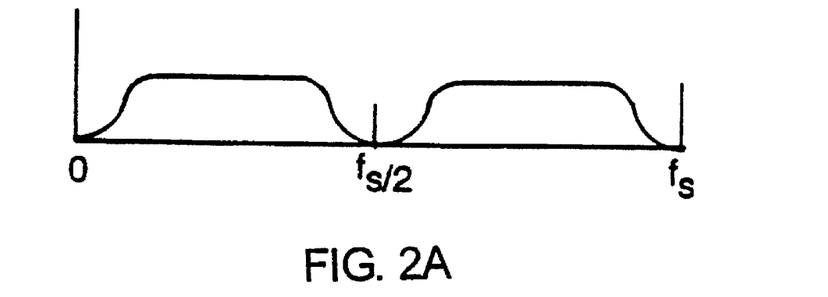
FIG. 2A illustrates the spectrum of a QAM signal which may serve as the input to the demodulator of FIG. 1.
Figure 3A:
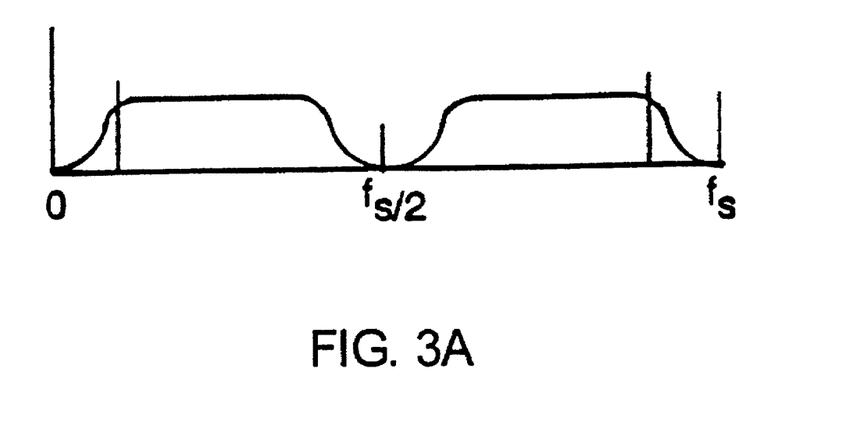
FIG. 3A illustrates the spectrum of a VSB signal which may serve as the input to the demodulator of FIG. 1.

Both QAM and VSB signals for HDTV are expected to have a common bandwidth of approximately 6 MHZ and have a square-root raised cosine spectral shape. FIG. 2A illustrates the expected spectral shape of a QAM HDTV signal while FIG. 3A illustrates the expected spectral shape of a VSB HDTV signal. The VSB signal format currently being considered by the FCC for use with HDTV has an excess bandwidth of about 11%. Because there is presently no standard or likely standard for a QAM HDTV transmission system, the excess bandwidth that will be associated with future QAM HDTV systems can not be determined at this time. However, to match the efficiency of the VSB system presently under consideration by the FCC, the excess bandwidth of QAM HDTV signals will probably be in the range of 10–20%.

Because of the similarity between QAM and VSB HDTV signals, it is possible, in accordance with the present invention, to use the single Nyquist filter 112 to process both types of signals.

A signal, either a QAM signal such as the one illustrated in FIG. 2A or the VSB signal illustrated in FIG. 3A, is supplied to the input of the A/D converter 102 by, e.g., a tuner. The tuner centers the VSB or QAM signal of interest at approximately one quarter the sampling rate ($f_s/4$) of the A/D converter 102, where the sampling rate is, e.g., four times the QAM symbol rate or twice the VSB symbol rate.

Because VSB uses vestigial sideband filtering, its symbol rate should be approximately twice the signal bandwidth, which corresponds to about twice the expected QAM symbol rate. Thus, in accordance with the present invention, the sampling rates of VSB and QAM are approximately the same, differing only due to differences in excess bandwidth.

When only QAM signals need be demodulated, a QAM demodulator which performs filtering using a single combined complex phase-splitting/Nyquist filter may be used. Such a combined complex phase-splitting/Nyquist filter takes the real value output by the A/D converter 102, passband filters the signal using a filter with a matched Nyquist spectral shape and, at the same time, generates an inphase and quadrature phase signal component. Thus, the output of such a combined complex phase-splitting/Nyquist filter is an analytic signal.

In such a QAM demodulator system, small offsets in frequency from the nominal passband become linear distortions in the band edges and cause inter-symbol interference (ISI). ISI can normally be corrected by use of an equalizer. Frequency offsets of the magnitude expected from commercial tuners are expected to be within the tolerance range of such a QAM demodulator system.

In a VSB demodulator system, a similar filter structure to the QAM demodulator filter structure described above could be used. However, the VSB signal has a pilot tone in the band edge which is used for VSB carrier recovery. If a tuner, in such a system, has an offset in frequency at the input to the Nyquist filter, the pilot tone might be attenuated. In such a system, a frequency offset of 100 KHz could result in as much as a 20 dB attenuation of the pilot tone. The attenuation of the pilot tone could disrupt VSB carrier recovery and prevent demodulation of the VSB signal.

Figure 2B:
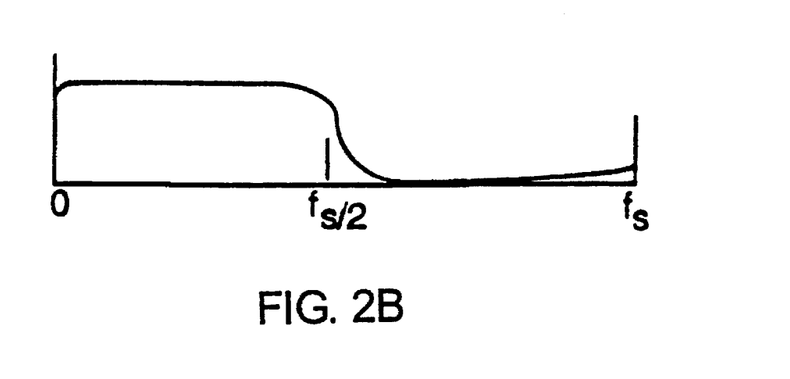
FIG. 2B illustrates an exemplary frequency response for the phase split filter of FIG. 1.
Figure 3B:
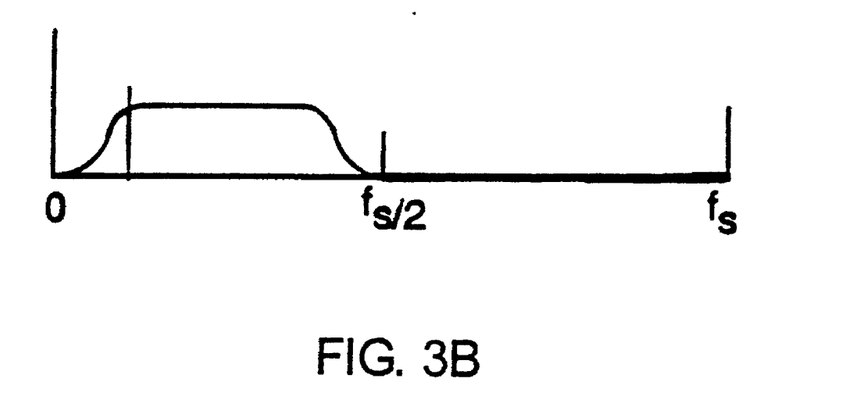
FIG. 3B is the spectrum of the VSB signal of FIG. 3A after being filtered by the phase split filter of FIG. 1.
Figure 3C:
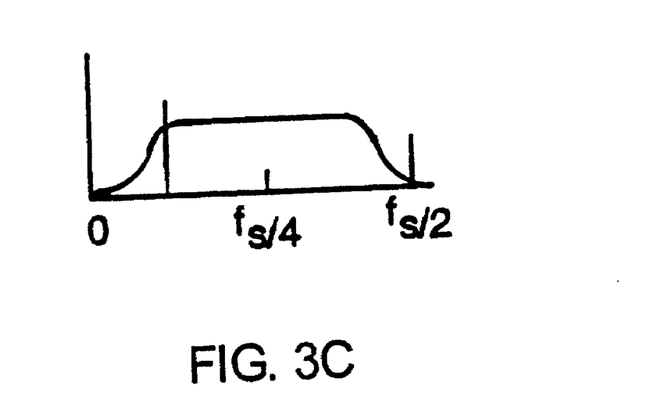
FIG. 3C illustrates the spectrum of the VSB signal output by the phase splitter of FIG. 1 after decimation by the decimator of FIG. 1.

To avoid the carrier recovery problems that can result from the above described filtering approach, the demodulator 100, uses the phase splitter filter 104 which is separate from the Nyquist filter 112. The phase splitter filter 104 has a frequency response as illustrated in FIG. 2B. The phase splitter filter 104 receives the VSB signal from the A/D converter 102 and outputs a VSB signal having the spectrum illustrated in FIG. 3B. During VSB operation, the output of the phase splitter filter 104 is decimated by a factor of two through the use of the decimator 106. The decimation of the VSB signal does not result in the loss of important information since the sampling of the VSB signal is done at twice the VSB symbol rate and because the signal is analytic. FIG. 3C shows the VSB signal after decimation by the decimator 106.

The output of the decimator 106 is used for carrier recovery which is performed by the carrier recover circuit 116. During VSB mode operation, the first MUX 108 outputs to the mixer 110 the decimated VSB signal. This signal is mixed with the output of the carrier recovery circuit 116 which, during VSB mode, is supplied to the mixer 110 via the second MUX 114. The output of the carrier recovery circuit 116, which is a complex signal, corrects for the frequency offsets introduced by, e.g., the tuner. Thus, the signal output by the decimater 106 is adjusted to be properly located for the bandwidth of the Nyquist filter 112. The frequency correction can be done at either baseband, e.g., with the pilot tone mixed to D.C., or at passband.

Figure 3D:
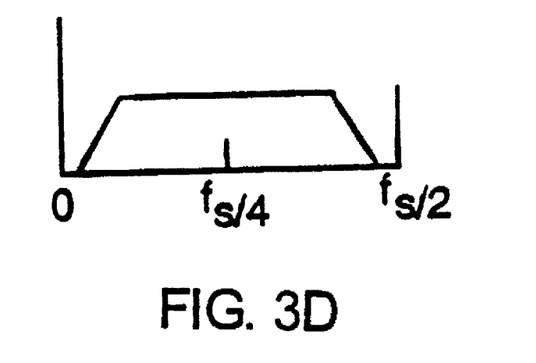
FIG. 3D illustrates the frequency response of the Nyquist filter of FIG. 1 during VSB mode operation.
Figure 3E:
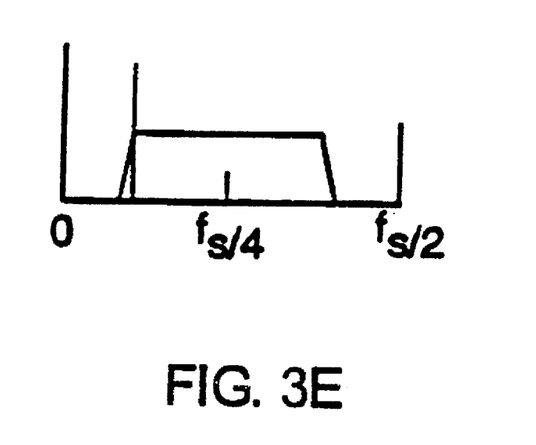
FIG. 3E illustrates the spectrum of the VSB signal after Nyquist filtering is performed.

The output of the mixer 110 is supplied to the input of the Nyquist filter 112. Thus, in accordance with the present invention, VSB carrier recovery is done after phase splitting but prior to Nyquist filtering. The frequency response of the Nyquist filter, during VSB mode operation, is illustrated in FIG. 3D while the spectrum of the VSB signal output by the Nyquist filter 112 is illustrated in FIG. 3E.

The architecture comprising separate phase-split and Nyquist filtering can, in accordance with the present invention, also be used for QAM filtering in, e.g., the demodulator 100. While such a filtering approach may require slightly more hardware to implement than the previously described QAM demodulator filter approach, it is well suited for a joint QAM/VSB demodulator such as the demodulator 100.

The operation of the joint QAM/VSB demodulator 100 will now be discussed in detail. The sampled real signal produced by the A/D converter 102 is supplied to the phase split filter 104. The output of the phase split filter 104 is supplied to the first input of the MUX 108 and to the decimator 106. Thus, the output of the phase split filter 104 is decimated in the case of VSB signals by the decimater 106 and supplied to the carrier recovery circuit 116. The carrier recovery circuit 116 generates a signal which is used to mix the decimated VSB signal to $f_s/8$.

The first input of the MUX 108 is the QAM signal input which is coupled directly to the output of the phase split filter 104. The first MUX 108, which is controlled by the MTS signal, determines whether the QAM signal output by the phase split filter 104, or the VSB signal output by the decimator 106, is supplied to the first input of the mixer 110.

The second MUX 114 selects the frequency reference signal which is supplied to the second input of the mixer 110. In VSB mode, the frequency reference signal is output by the carrier recovery circuit 116. This signal is used to translate the VSB pilot tone to precisely $f_s/8$. In QAM mode the frequency reference signal may be one of several things. It can be a zero frequency signal (D.C.) if the tuner places the QAM signal at exactly $f_s/4$. However, if the tuner had only one final I.F. frequency, a choice has to be made. Assuming different sample rates ($f_s$) for QAM and VSB, and only one final IF frequency, the tuner could be made to center the signal at $f_s(VSB)/4$ which is the VSB sample rate/4, $f_s(QAM)/4$ which is the QAM sample rate/4, or a compromise. If the IF frequency is not $f_s(QAM)/4$, then the input to the mixer 110 during QAM mode, should include a fixed, known offset, which would be corrected ahead of the Nyquist filter. The QAM input to the second MUX 114 may also be a feedback signal from the QAM carrier recovery loop, to position the QAM signal at exactly $f_s(QAM)/4$.

The output of the mixer 110 is supplied to the input of the Nyquist filter 112 which operates at, e.g., twice the VSB symbol rate during VSB mode operation and four times the symbol rate during QAM mode operation. The MTS signal which is supplied to the Nyquist filter 112 controls the Nyquist filter, in accordance with the present invention, to operate in either a QAM or VSB mode of operation.

Figure 2C:
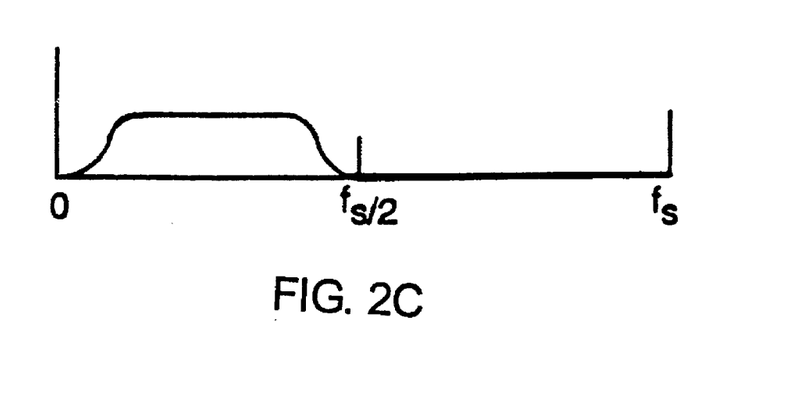
FIG. 2C illustrates the spectrum of the QAM signal of FIG. 2A after being filtered by the phase split filter of FIG. 1.
Figure 2D:
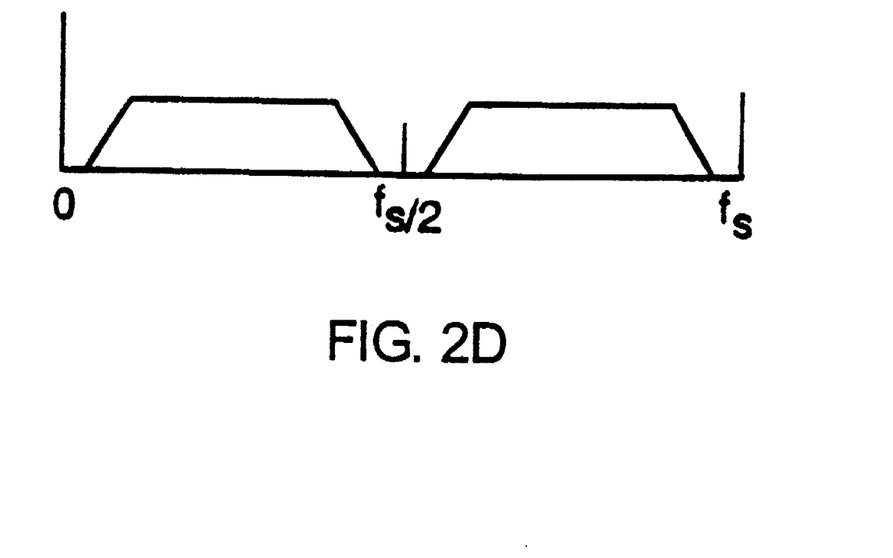
FIG. 2D illustrates the Nyquist filter response for the Nyquist filter of FIG. 1 when operating in QAM mode.
Figure 2E:
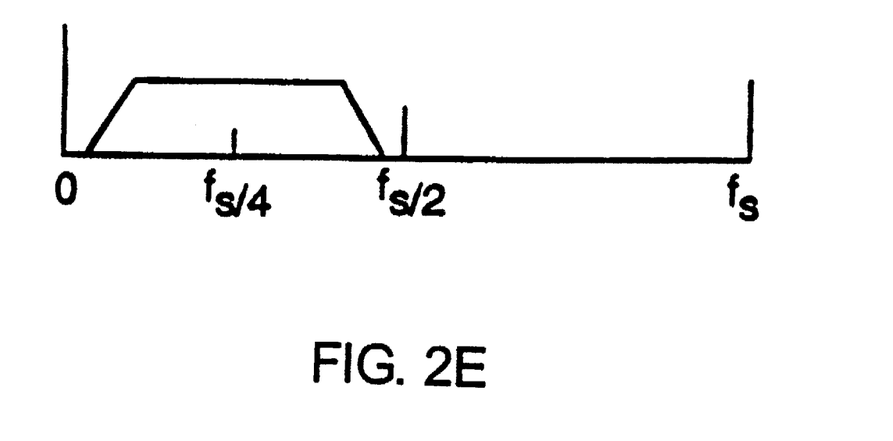
FIG. 2E illustrates the spectrum of the QAM signal of FIG. 2A after being filtered by the Nyquist filter of FIG. 1.

Referring now to FIG. 2C, there is illustrated a diagram of the spectrum of the QAM signal of FIG. 2A after the signal output by the A/D converter 102 phase split filter phase split filter 104 during QAM mode demodulator operation. As discussed above, the output of the phase split filter 104 is supplied to the mixer 110 during QAM mode. The output of the mixer 110, in turn, is supplied to the input of the Nyquist filter 112. FIG. 2D illustrates the frequency response of the Nyquist filter 112 during QAM mode operation. FIG. 2E illustrates the spectrum of the QAM signal output by the mixer 110 after being filtered by the Nyquist filter 112.

Various features of the Nyquist filter 112 of the present invention will now be discussed.

Use of the phase split filter 104 allows some simplifications to the design of the Nyquist filter used to process the QAM signal. Since the upper replicated spectrum of a received QAM signal will be canceled by the phase split filter 104, it is not necessary to use a complex valued filter for the Nyquist filter 112, even in QAM mode.

Note also that, since the passband of the Nyquist filter 112, illustrated in FIG. 2D is centered at $f_s/4$ and the passband is symmetrical about $f_s/4$, every other tap weight of the Nyquist filter 112 is zero. This is because the passband filter is equivalent to taking a baseband low pass filter with the desired cut-off and multiplying the vector of N filter cells by $\cos(n\pi/2)$, where n=[0 through N-1].

During QAM mode, as discussed above, the QAM signal is not decimated after the phase splitter because a $4f_s$ signal is desired at the output of the Nyquist filter for timing recovery.

If, during VSB mode operation, the VSB signal is mixed to passband, the pilot tone is mixed to $f_s/8$ which is equivalent to $\pi/2$ after decimation. Such a filter can be filtered by the same Nyquist filter 112 as the QAM signal. Since the VSB signal is decimated before Nyquist filtering, the zero valued taps of the Nyquist filter 112 are deleted for VSB mode operation in accordance with the present invention. This is achieved during VSB mode operation, as will be discussed further below, by using MUXes to bypass the Nyquist filter delay elements which are used during QAM mode operation to implement the zero valued taps of the Nyquist filter 112. Thus, during QAM mode, the Nyquist filter 112, has twice as many taps than it does during VSB mode. However, during QAM mode, half the taps have zero for their tap coefficient values, such that no multiplier is required to implement these taps.

Figure 4:
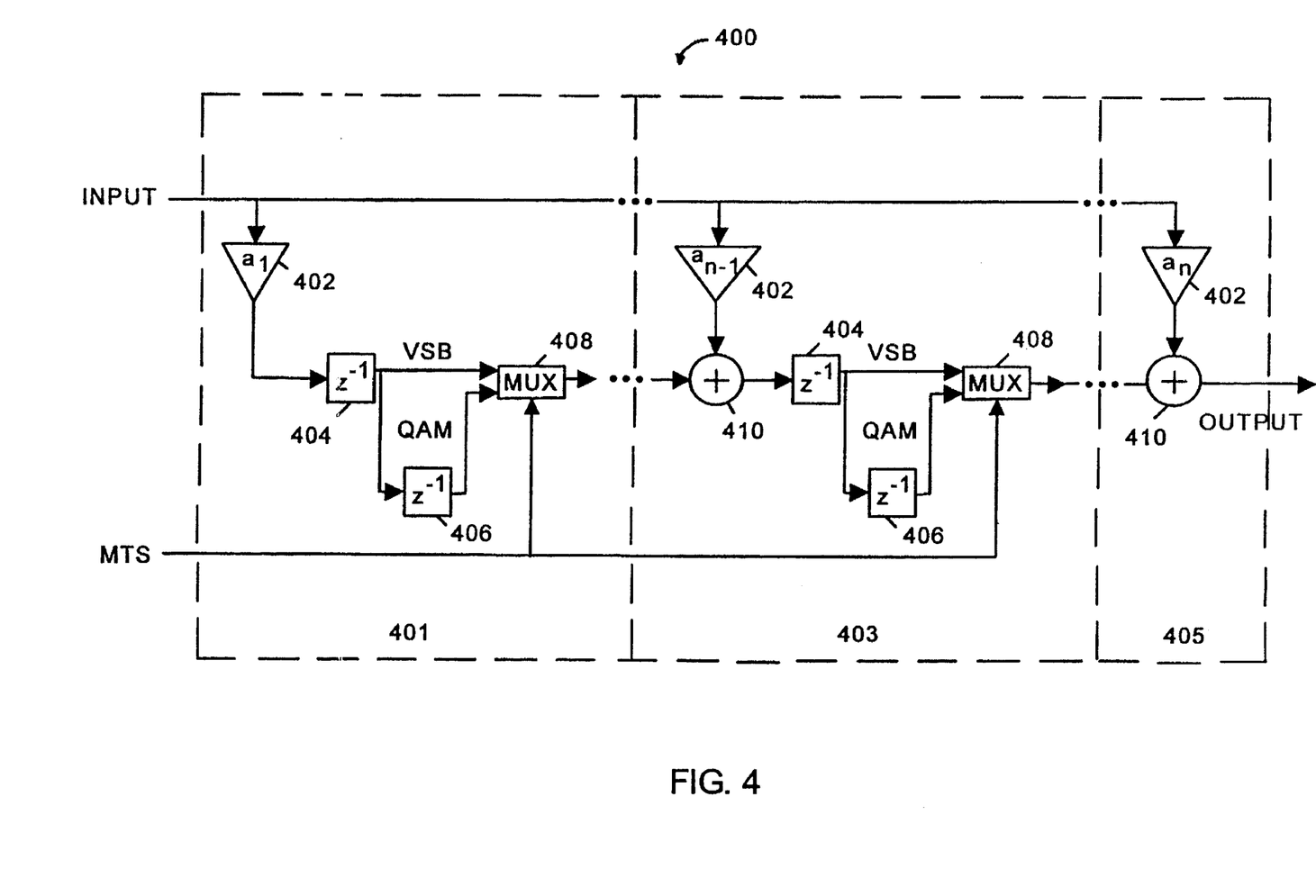
FIG. 4 is a schematic block diagram of the transposed form of a Nyquist filter, implemented in accordance with the present invention, that can be used as the Nyquist filter of FIG. 1.

Referring now to FIG. 4, a Nyquist filter 400 implemented in accordance with the present invention, is illustrated in transposed form. The Nyquist filter 400 may be used as the Nyquist filter 112 of the joint VSB/QAM demodulator 100.

The Nyquist filter 400, which is an N-tap filter during VSB mode and a 2N tap filter during QAM mode, comprises a series of N filter cells 401, 403, 405 connected together with the output of each previous filter cell 401, 403 being supplied as an input to the next filter cell in the sequence. During VSB mode, each cell acts as a single tap of the N tap Nyquist filter. During QAM mode each filter cell acts as two taps, one of which has a coefficient of zero. This additional tap with a coefficient of zero is implemented by MUXing in an additional unit delay element into each filter cell's signal path during QAM mode operation.

In the embodiment illustrated in FIG. 4, the Nyquist filter 400 comprises N-2 filter cells 403, a first filter cell 401 and a last filter cell 405.

Each of the N-2 filter cells 403 comprise a multiplier 402, a summer 410, a first unit delay element 404, a second unit delay element 406, and a multiplexer (MUX) 408.

The input of the multiplier 402 is coupled to a sample input of the Nyquist filter 400 so that the multiplier 402 receives therefrom the samples supplied to the Nyquist filter 400. The gain of the multiplier 402 of each filter cell 401, 403, 405 is controlled independently by the selection of different tap coefficients or weights. In the diagram of FIG. 4, the coefficient assigned to the multiplier 402, of each filter cell 401, 403, 405, is represented by the letter "a" followed by a subscript identifying the filter cell in the sequence of N filter cells to which the coefficient corresponds. For example, $a_1$ is used to represent the coefficient assigned to the first filter cell 401 in the series of N filter cells 401, 403, 405, $a_{n-1}$ is used to represent the coefficient assigned to the second from last filter cell 403 in the series of N filter cells, and $a_n$ is used to represent the coefficient assigned to the last filter cell 405.

The multiplier 402 multiplies the input sample by the coefficient associated with the filter cell and supplies the result to a first input of the summer 410. The second input of the summer 410 is coupled to the output of the preceding filter cell. The output of the summer 410 is coupled to the input of the first unit delay element 404.

The summer 410 sums the output of the multiplier 402 and the output from the previous filter cell to generate a signal which is supplied to the first unit delay element 404.

The output of the first unit delay element 404 is coupled to both a first signal input, e.g., a VSB signal input, of the MUX 408 and the input of the second unit delay element 406. The output of the second unit delay element 406 is coupled to the second input, e.g., the QAM signal input, of the MUX 408. The MUX 408 receives as a control signal, the MTS signal, which is used to control whether the Nyquist filter 400 operates in QAM or VSB mode.

When the MTS signal is in a first state indicative of QAM mode operation, the MUX 408 outputs the signal supplied to its second input, i.e., the QAM signal that was delayed for two unit delay periods. However, when the MTS signal is in a second state indicative of VSB mode operation, the MUX 408 outputs the signal supplied to its first input terminal, i.e., the VSB signal that was delayed only for a single unit delay time period. In this manner, during QAM mode, the second unit delay element 406, which acts as a tap with a zero coefficient, is inserted into the QAM signal path.

It is possible to implement the Nyquist filter 400 using N filter cells which are the same as, or similar to the N-2 filter cells 403. In such an embodiment, the input to the summer 410, of the first filter cell would be coupled to ground or "zero" since there is no preceding filter cell from which to receive a filter cell output signal. Also, in such an embodiment, the first and second unit delay elements 404, 406 and MUX 408, of the last filter cell, would merely delay the output of the filter 400 without changing it. Since the summer 410 of the first filter cell and the unit delay elements and MUX in the last filter cell do not change the filter output, as illustrated in FIG. 4, it is possible to implement the Nyquist filter 400 without such circuitry.

In the case of the first filter cell 401, of the series of N-filter cells 401, 403, 405 illustrated in FIG. 4, the filter cell 401 is not coupled to the output of a previous filter cell. Accordingly, the summer 410 is not used in the first filter cell 401. Thus, in the first filter cell 401, the output of the multiplier 402 is coupled directly to the input of the first unit delay element 404.

The last filter cell 405 comprises a multiplier 402 and summer 410. In the case of the last filter cell 405, in the illustrated embodiment, the first and second unit delay elements 404, 406 and MUX 408 are omitted since, as discussed above, these elements would merely delay the output of the filter 400.

It should be noted that Nyquist filters, suitable for use with QAM and/or VSB HDTV signals, having 64, 128, or any other numbers of taps, can be implemented in accordance with the present invention.

Figure 5:
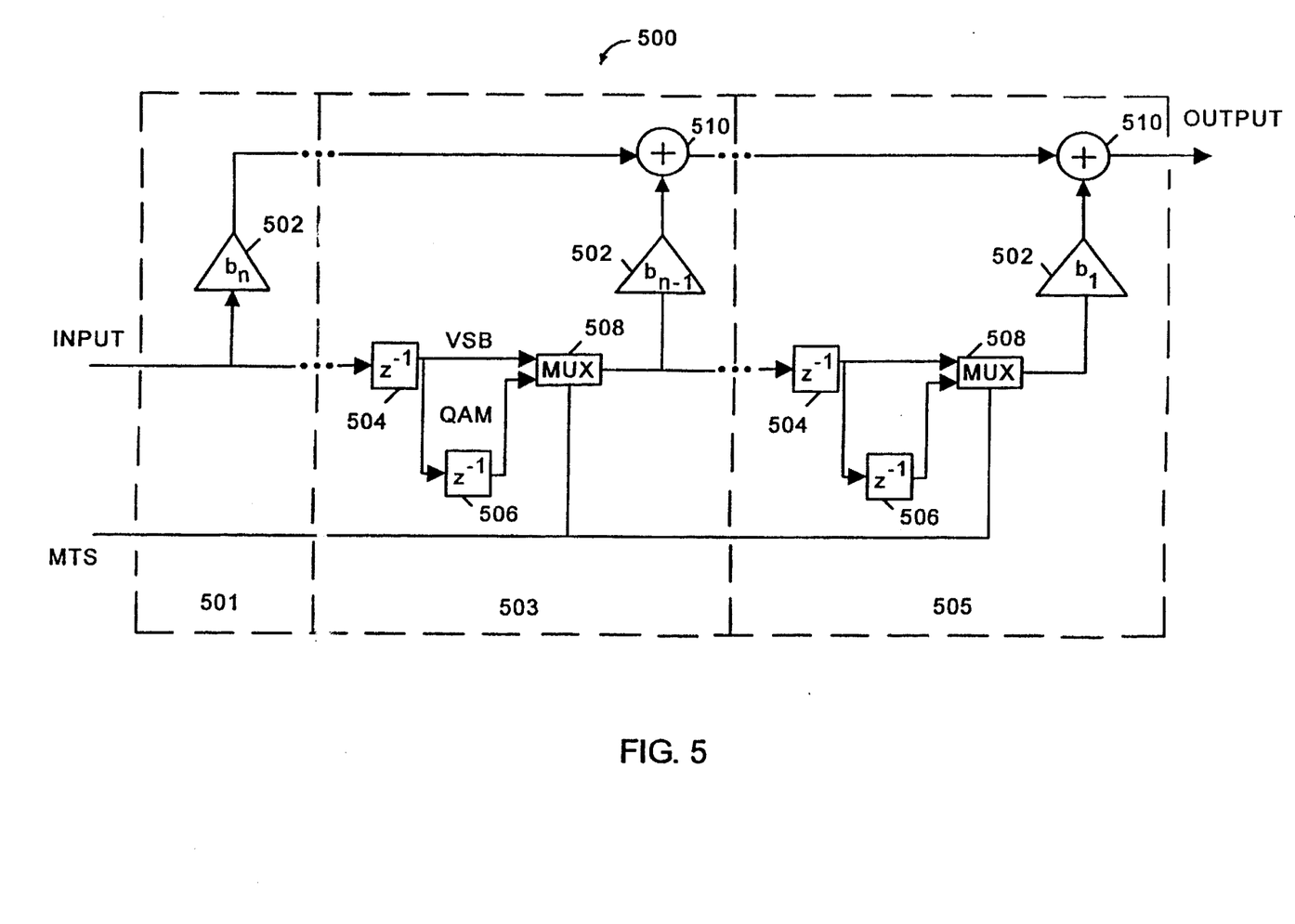
FIG. 5, is a schematic block diagram illustrating the direct implementation of a Nyquist filter of the present invention.

Referring now to FIG. 5, there is illustrated a schematic block diagram showing the direct implementation of the Nyquist filter of the present invention.

In the embodiment illustrated in FIG. 5, the Nyquist filter 500 comprises a series of first through $n^{th}$ filter cells 501, 503, 505.

Each of the second through $n^{th}$ filter cells 503, 505 comprise a first unit delay element 504, a second unit delay element 506, a multiplexer (MUX) 508, a multiplier 502, and a summer 510.

The input of the first unit delay element 504 is coupled to the sample input of the Nyquist filter 500. The output of the first unit delay element 504 is coupled to both a first signal input, e.g., a VSB signal input, of the MUX 508 and the input of the second unit delay element 506. The output of the second unit delay element 506 is coupled to the second input, e.g., the QAM signal input, of the MUX 508. The MUX 508 receives as a control signal, the MTS signal, which is used to control whether the Nyquist filter 500 operates in QAM or VSB mode.

When the MTS signal is in a first state indicative of QAM mode operation, the MUX 508 outputs the signal supplied to its second input, i.e., the QAM signal that was delayed for two unit delay periods. However, when the MTS signal is in a second state indicative of VSB mode operation, the MUX 508 outputs the signal supplied to its first input terminal, i.e., the VSB signal that was delayed only for a single unit delay time period. In this manner, during QAM mode, the second unit delay element 506, which acts as a tap with a zero coefficient, is inserted into the QAM signal path.

The input of the multiplier 502 is coupled to the output of the MUX 508 so that it receives therefrom the delayed samples. The gain of the multiplier 502 of each filter cell 501, 503, 504 is controlled independently by, e.g., selecting prior to implementation, different tap coefficients or weights. In the diagram of FIG. 5, the coefficient assigned to the multiplier 502, of each filter cell 501, 503, 505, is represented by the letter "b" followed by a subscript identifying the filter cell in the sequence of N filter cells to which the coefficient corresponds. For example, $b_n$ is used to represent the coefficient assigned to the first filter cell 501 in the series of N filter cells 501, 503, 505, $b_{n-1}$ is used to represent the coefficient assigned to the second filter cell 503 in the series of N filter cells, and $b_1$ is used to represent the coefficient assigned to the last filter cell 505.

The multiplier 502 multiplies the delayed sample by the coefficient associated with the filter cell and supplies the result to a first input of the summer 510. A second input of the summer 510 is coupled to the output of the previous filter cell in the series on N filter cells.

The summer 510 sums the output of the previous filter cell and the output of the MUX 508 to generate a signal which represents the output of the filter cell 501, 503 or 505. In the case of the last filter cell 505, the signal produced by the summer 510 represents the output of the Nyquist filter 500.

The Nyquist filter 500 could be implemented using N filter cells which are the same as, or similar to the second through $n^{th}$ filter cells 503, 505. In such an embodiment, the second input of the summer 510 would be tied to ground or "zero" since there is no previous filter output to be coupled to. The use of the first and second delays 504, 506 and MUX 508 would merely delay the output of the filter 500 without altering it. Thus, such circuitry can be eliminated without affecting the output of the filter 500.

Accordingly, in the illustrated embodiment, the first cell 501 of the Nyquist filter 500 comprises the multiplier 502, as illustrated in FIG. 5, but not the first and second unit delay elements 506, MUX 508 or summer 510.

While the inputs and outputs of the filters 400, 500 are illustrated as single lines, it is to be understood that the input and output signals can be either real or complex depending on the particular embodiment.

It should be noted that if the excess bandwidths of the QAM and VSB modulation signals are close enough, the same filter coefficients can be used in both QAM and VSB modes of operation. However, if the induced inter-symbol interference (ISI) is sufficiently large that an equalizer coupled to the output of the Nyquist filter 112 can not correct it, then the tap weights could be modified in the Nyquist filter 112, 400 based on the modulation format, e.g., one set of filter coefficients could be used for QAM mode operation with another set of filter coefficients being used for VSB mode operation. While this would add to the complexity of the Nyquist filter 112, 400 it may still be possible to create CSD filter designs, in accordance with the present invention, in which the tap coefficients vary by only one bit or a very small number of bits to minimize filter complexity.

What is claimed is:

1. A method of implementing a filter capable of operating in two different modes of operation, comprising the steps of:
providing a plurality of N filter cells, each of the N filter cells including first and second unit delay elements, where N is a positive integer greater than one, each of the N filter cells having a signal path through which a signal supplied to the filter cell passes;
arranging the first unit delay element of each of the N filter cells to be in the signal path of the filter cell; and
selectively inserting the second unit delay element of each of the N filter cells into the signal path of the N filter cells in response to a single control signal used to control the N filter cells to operate in the same mode of operation at any given time.

2. The method of claim 1, further comprising the steps of:

providing a multiplexer in each of the N filter cells; and wherein the step of selectively inserting the second unit delay element comprises the step of using the multiplexer in each one of the N filter cells to divert the signal path of each of the N filter cells to pass through the second unit delay element.

3. The method of claim 1, wherein the control signal is a modulation type selection signal; and wherein the step of selectively inserting the second unit delay element is performed in response to a first state of the modulation type selection signal indicative of a quadrature amplitude modulation mode of filter operation.

4. The method of claim 3, wherein each of the N filter cells operates as two taps of a finite impulse response filter when the first and second unit delay elements of each cell are in the signal path of each cell and wherein each filter cell operates as one tap of a finite impulse response filter when the second unit delay element of each cell is not inserted into the signal path of each cell.

5. The method of claim 4, wherein the signal path is a real signal path.

6. The method of claim 4, wherein the signal path is a complex signal path.

7. A filter capable of operating in two distinct modes of operation for filtering a signal in response to a modulation type selection signal indicative of the modulation type of the signal being filtered, comprising:

a plurality of N filter cells, each of the N filter cells including a filter cell input and a filter cell output, the N filter cells being coupled in series such that the output of each one of the second through Nth filter cells has its filter cell input coupled to the filter cell output of the preceding filter cell in the plurality of N filter cells to form a series arrangement of filter cells;

each of the N filter cells further comprising:

a first unit delay element coupled to the filter cell input;

a second unit delay element coupled to the first unit delay element;

a first multiplexer having a first input coupled to the first unit delay element, a second input coupled to the second unit delay element, and a control signal input for receiving the modulation type selection signal; and wherein each filter cell's first multiplexer is responsive to the modulation type selection signal to selectively couple one of the first and second inputs to the filter cell's first multiplexer to an output of the filter cell's first multiplexer.

8. The filter of claim 7, wherein each one of the N filter cells further includes:

a first multiplier coupling the filter cell input to the first unit delay element, the first multiplier having a gain corresponding to a first tap coefficient.

9. The filter of claim 8, wherein each one of the N filter cells acts as a single tap finite impulse response filter when the first input of the first multiplexer is coupled to the output of the first multiplexer and as a 2 tap finite impulse response filter when the second input of the first multiplexer is coupled to the output of the first multiplexer.

10. The filter of claim 8, wherein the filter is a real Nyquist filter.

11. The filter of claim 8, wherein the filter is a complex Nyquist filter.

* * * * *